(12) United States Patent
Donig et al.

(10) Patent No.: US 7,199,667 B2
(45) Date of Patent: Apr. 3, 2007

(54) INTEGRATED POWER AMPLIFIER ARRANGEMENT

(75) Inventors: Günter Donig, Poing (DE); Winfried Bakalski, Friedberg (DE); Hans-Dieter Wohlmuth, München (DE); Krzysztof Kitlinski, München (DE)

(73) Assignee: Infineon Technologies AG, Munich (DE)

( * ) Notice: Subject to any disclaimer, the term of this patent is extended or adjusted under 35 U.S.C. 154(b) by 40 days.

(21) Appl. No.: 10/950,982

(22) Filed: Sep. 27, 2004

(65) Prior Publication Data

US 2005/0104664 A1 May 19, 2005

(30) Foreign Application Priority Data

Sep. 30, 2003 (DE) .................... 103 45 498

(51) Int. Cl.
*H03F 3/04* (2006.01)
(52) U.S. Cl. ...................... 330/310; 330/302
(58) Field of Classification Search ............ 330/98, 330/302, 310
See application file for complete search history.

(56) References Cited

U.S. PATENT DOCUMENTS 4,985,642 A * 1/1991 Gamand ................. 330/277
5,745,857 A * 4/1998 Maeng et al. ............ 330/310
6,052,029 A * 4/2000 Uda et al. ............... 330/302
6,897,732 B2 * 5/2005 Iwai ....................... 330/302
6,998,321 B2 * 2/2006 Park ....................... 257/531

FOREIGN PATENT DOCUMENTS

DE 195 34 382 A1 3/1996
EP 0 309 163 B1 3/1989

OTHER PUBLICATIONS

"Halbleiterschaltungen der Leistungselektronik" ("Semiconductor Circuits of Power Electonics"), Alfred Neye, Enatrchnik GmbH, Quickborn, Hamburg, 1971, pp. 276 and 289.

* cited by examiner

*Primary Examiner*—Khanh Van Nguyen
(74) *Attorney, Agent, or Firm*—Eschweiler & Associates, LLC

(57) ABSTRACT

An integrated power amplifier arrangement with multistage construction is provided, in which a matching filter with integrated capacitance and inductance for impedance transformation is provided between an input transistor and an output transistor. In one example, the inductance of the matching filter is formed as a microstrip conductor, resulting in a significantly higher quality factor of the inductance and hence an improved linearity and an improved efficiency of the integrated power amplifier. The invention can advantageously be employed in particular in integrated transmitting arrangements.

14 Claims, 4 Drawing Sheets

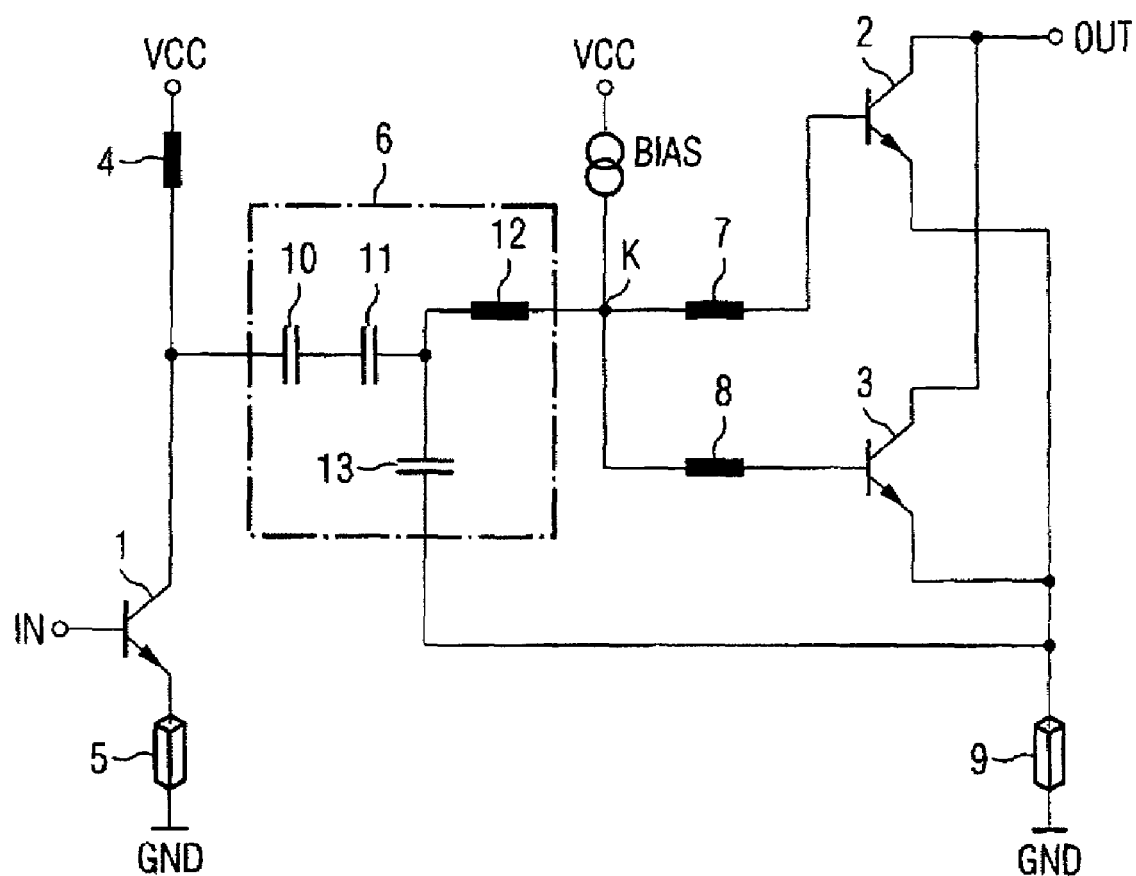
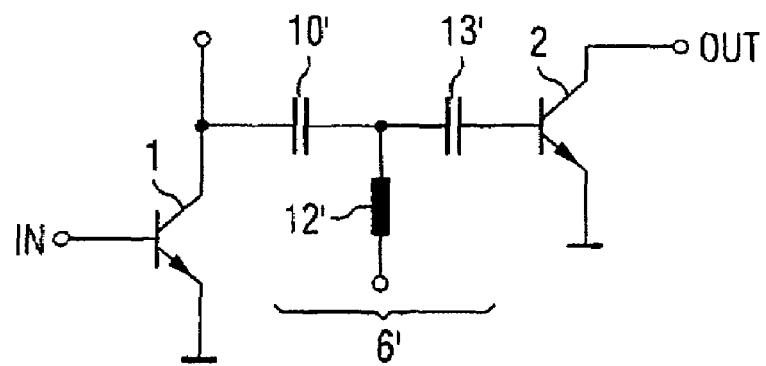

INTEGRATED POWER AMPLIFIER ARRANGEMENT

REFERENCE TO RELATED APPLICATIONS

This application claims the benefit of the priority date of German application DE 103 45 498.5, filed on Sep. 30, 2003, the contents of which are herein incorporated by reference in their entirety.

FIELD OF INVENTION

The present invention relates to power amplifiers, and particularly to an integrated power amplifier arrangement with multistage construction, having an input transistor with a terminal for feeding an input signal, an output transistor with a terminal for providing an output signal, and a matching filter with at least one capacitance and an inductance designed for impedance transformation, which couples the input transistor to the output transistor.

An integrated power amplifier arrangement of the generic type is shown, for example, in the document "Halbleiterschaltungen der Leistungselektronik" ["Semiconductor circuits of power electronics"], Alfred Neye-Enatechnik GmbH, Quickborn, Hamburg, 1971, page 276, where a matching filter referred to as a coupling filter is provided between a transistor arranged on the input side and a transistor arranged on the output side, where the filter has capacitances and inductances. The matching filter fulfills two important tasks. Firstly, it is used to transform the various impedances to the values required for active and passive components. Secondly, it is also intended to act selectively; that is to say under the influence of its resonant quality factor, the energy contained in the harmonics is intended to be converted into operating frequency fundamental energy and the occurrence of undesirable frequency components at the output is intended to be prevented.

Integrated power amplifier arrangements with a plurality of stages between which a matching filter circuit is provided, can advantageously be employed in radiofrequency amplifiers. In particular, a power matching that can be obtained with the matching filter can preferably be employed in power amplifiers. Such power amplifiers are found for example in transmission paths of radio transmitting arrangements.

In particular, in integrated power amplifiers, provision may be made for transforming the driver power to the very low-resistance base of the output transistor by means of a matching filter, comprising integrated capacitors and coils.

What is problematic about matching filters of this type is that integrated coils have a comparatively low quality factor primarily determined by substrate losses. Therefore, the achievable quality factor of a transformation network or matching filter is defined in particular by the coils that are used. This in turn results in limit values for the maximum achievable collector efficiency and the maximum achievable linearity of the amplifier.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later. The invention relates to integrated power amplifier arrangements by which improved efficiency and linearity may be achieved.

According to one or more aspects of the invention, the object is achieved by means of an integrated power amplifier arrangement in which at least one inductance in a matching filter between input transistor and output transistor is formed as a microstrip conductor.

Microstrip conductors are also referred to as microstriplines, strip conductors, or striplines. Microstrip conductors operate according to the principle of integrated waveguides.

In accordance with the principle proposed, provision is made of at least one integrated micro-stripline, which is used as an inductance in the matching filter. A micro-stripline of this type has the advantage that it has no lossy substrate portion. This significantly improves the quality factor of the integrated inductance. This in turn has the effect that the quality factor of the matching filter increases overall and, consequently, the efficiency and the linearity of the amplifier are also improved.

In the case of the integrated amplifier arrangement of the invention, the fact that microstrip conductors of integrated embodiments normally have a comparatively high parasitic capacitance can advantageously be utilized in that the matching filter has at least one capacitance anyway. This parasitic capacitance of the microstrip conductor can accordingly advantageously be concomitantly used to form desired capacitances in the matching filter.

The integrated power amplifier arrangement of the invention can be used particularly advantageously in matching filters which bring about a low-resistance matching.

In accordance with a preferred development of the principle proposed, the matching filter comprises a series circuit formed by a capacitance and the microstrip conductor, the capacitance being connected to an output of the input transistor by one terminal and being connected to a terminal of the microstrip conductor by another terminal.

The further terminal of the microstrip conductor is preferably connected to an input of the output transistor. A further capacitance is advantageously provided between the connecting node of capacitance and the microstrip conductor, and a reference potential terminal.

The reference potential terminal may be a substrate terminal or a ground terminal or may be connected, for example, via a so-called means for ground through-plating, referred to as sinker, to a reference potential node that is connected to the substrate via resistors and to the actual ground terminal via further resistors.

As an alternative, the shunt capacitance with respect to the reference potential and the microstrip conductor may also be interchanged in such a way that the series circuit of the matching filter comprises two capacitances that are connected between the output terminal of the input transistor and the input terminal of the output transistor. In this case, the microstrip conductor is connected to the connecting node between the two series capacitances. In this case, the further terminal of the microstrip conductor may either be connected to a reference potential or form a free end or open end.

The present principle can be employed particularly advantageously in such matching filters which are intended to bring about a low-resistance matching. A low-resistance matching of this type is preferably provided when the input resistance of the output transistor is less than or equal to 50 ohms.

The matching filter proposed is particularly preferably connected to the input of an output transistor of an amplifier whose input resistance is less than or equal to 20 ohms.

By way of example, a bipolar power transistor provided in an output stage of an amplifier usually has a particularly low-resistance base terminal, so that the driver power of the input stage can advantageously be transformed to the very low-resistance base of the output transistor by means of the matching filter.

The microstrip conductor may be implemented as a plurality of metalization planes on or in the integrated semiconductor body of an integrated semiconductor circuit. By way of example, the actual stripline may be embodied in one metalization plane, with a further metalization plane forming the reference potential plane.

The further metalization plane may be connected to the substrate in large-area fashion via a so-called ground through-plating or a so-called sinker, which substrate in turn produces a contact with the rear side metalization of the semiconductor body in large-area fashion on account of comparatively good electrical conduction properties. As a result, no bonding wires whatsoever are required for making contact with the further metalization plane. Moreover, a further reduced substrate loss is achieved on account of the large-area and low-resistance contact-making. Losses may be caused merely by the insulation between the metal plates of the strip conductor and by the skin effect.

The metal plates or metal strips of the microstrip conductor are preferably of essentially planar extent and arranged parallel to one another and also parallel to a main plane of the semiconductor body. The metal strips are preferably embodied such that they lie one above the other. An insulator or dielectric, such as an oxide layer, for example, may be arranged between the metal strips.

The proposed amplifier arrangement with a microstrip conductor in the matching filter can particularly preferably be employed, for example, in such power amplifiers which are provided in amplifier output stages of transmitting arrangements for carrier frequencies of 2.44 or 5.3 GHz.

The power amplifier arrangement in accordance with the invention can advantageously be integrated both in bipolar circuit technology and in metal insulator semiconductor circuit technology, that is to say unipolar circuit technology.

BRIEF DESCRIPTION OF THE DRAWINGS

The invention is explained in more detail below using a plurality of exemplary embodiments with reference to the drawings, in which:

FIG. 1 is a circuit diagram illustrating a first exemplary integrated power amplifier arrangement in accordance with the invention;

FIG. 2 is a circuit diagram illustrating a second exemplary integrated power amplifier arrangement in accordance with the invention;

DETAILED DESCRIPTION OF THE INVENTION

Figure 3:
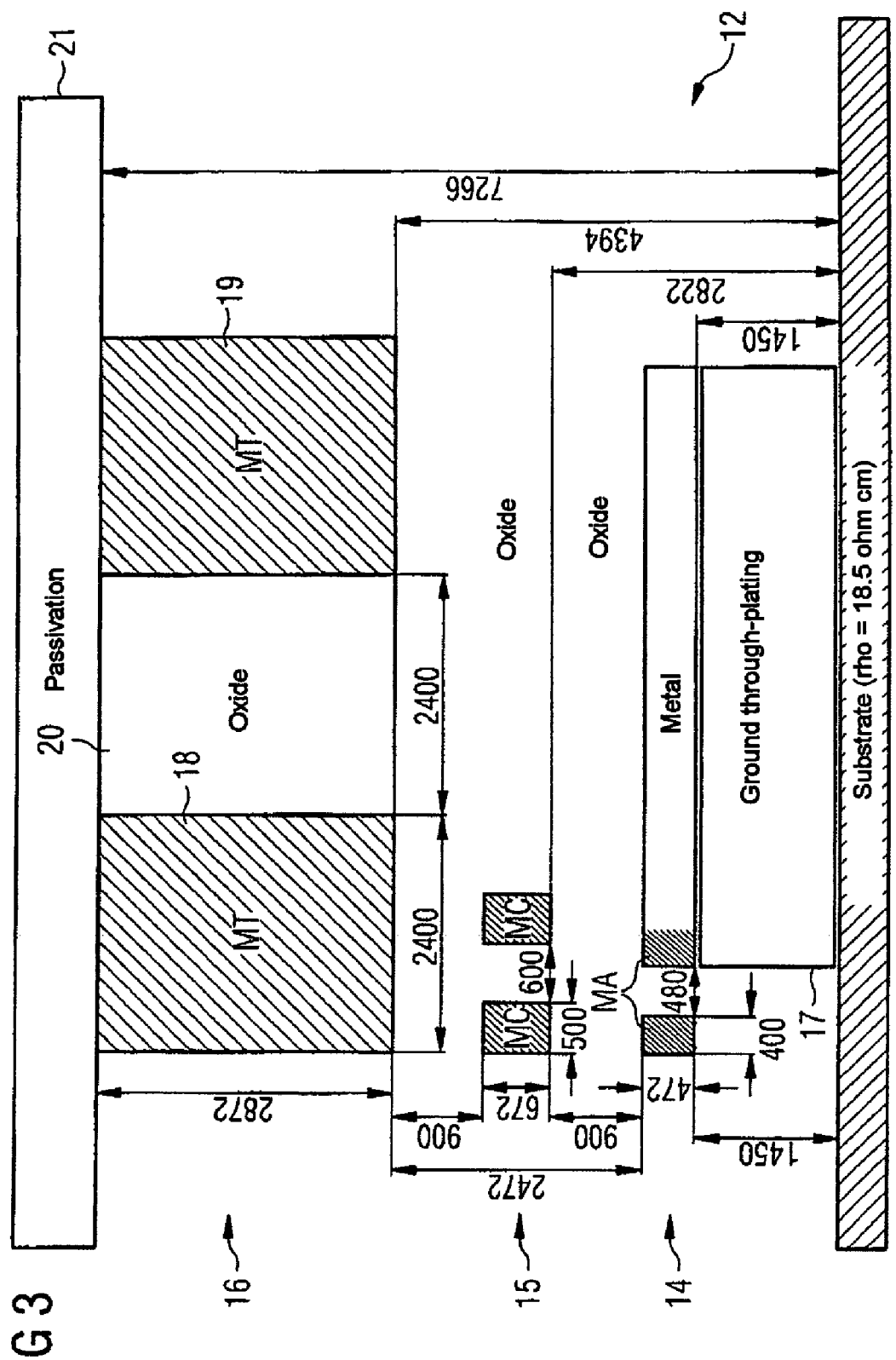
FIG. 3 illustrates an exemplary microstrip conductor as an inductance in accordance with the invention.

FIG. 1 shows an exemplary integrated power amplifier arrangement with an input transistor 1 and two output transistors 2, 3 connected in parallel. Input and output transistors 1, 2, 3 are embodied as NPN bipolar transistors. The base terminal of the input transistor 1 forms an input of the multistage amplifier arrangement, to which an input signal IN may be applied or fed. The common collector output of the output transistors 2, 3 forms the signal output of the amplifier arrangement. The collector terminal of the input transistor 1 is connected to a supply potential terminal VCC via an inductance 4. The emitter terminal of the input transistor 1 is connected to a reference potential terminal via a through-plating means 5. Furthermore, a matching filter 6 is connected to the collector terminal of the input transistor 1, which forms the output of the input transistor 1. The output of the matching filter 6 is connected to a circuit node K, which forms the input terminal of the output transistors 2, 3. The circuit node K is coupled to a respective base terminal of the output transistors 2, 3 via a respective parasitic inductance 7, 8. The emitter terminals of the output transistors 2, 3 are connected to one another and, via a further means for through-plating 9, to a reference potential terminal GND.

The matching filter 6 comprises a series circuit formed by a series capacitance 10, 11 and, connected downstream, an integrated microstrip conductor 12, which forms a series inductance. The connecting node between the series capacitance 10, 11 and the series inductance 12 is coupled to the reference potential terminal GND via a shunt capacitance 13 and via the through-plating means 9. The series capacitance 10, 11 itself comprises a series circuit formed by two partial capacitances 10, 11 in order to increase the dielectric strength of the series capacitance 10, 11. For the purpose of setting the operating point of the output transistors 2, 3, the circuit node K is coupled with the supply potential terminal VCC via a bias current source BIAS.

The realization of the inductance 12 of the matching filter for impedance transformation as a microstrip conductor, that is to say as an integrated waveguide, results in a high quality factor of the inductance 12 and thus also in a particularly high quality factor of the matching filter 6 overall. This, in turn, facilitates a high efficiency and also a particularly good linearity and improved saturation properties of the amplifier.

FIG. 2 shows another exemplary matching filter 6' between the input transistor 1 and the output transistor 2 of an amplifier. In the present case, the shunt capacitance 13 and the inductance 12 have been interchanged and are designated as shunt inductance 12' and further series capacitance 13' in FIG. 2. Consequently, a series circuit comprising a first series capacitance 10' and a second series capacitance 13' is coupled between the collector terminal of the input transistor 1 and the base terminal of the output transistor 2. The connecting node between the two series capacitances 10', 13' is connected to one terminal of a microstrip conductor (shunt inductance) 12'. The further terminal of the microstrip conductor 12' forms an open end.

The functioning and the advantageous mode of operation of the integrated power amplifier of FIG. 2 correspond to those of FIG. 1 on account of the properties of the matching filter with a microstrip conductor as inductance and are therefore not repeated at this point.

FIG. 3 shows, by way of example, the structure of an integrated microstrip conductor 12' as can be employed in the circuits in accordance with FIGS. 1 and 2. In the present case, the microstrip conductor 12 is constructed in a bipolar circuit technology having three metalization planes 14, 15, 16. All of the metalization planes 14, 15, 16 are arranged parallel to one another and to a main plane of the entire semiconductor body.

The first metalization plane 14 is embodied in aluminum and is connected to the underlying substrate in large-area fashion by means of a ground through-plating or sinker 17. The middle metalization plane 15 is not used in the case of the present microstrip conductor. The third metalization plane 16 comprises two metal strips 18, 19 that are arranged in one plane and are separated from one another by an oxide region 20. A passivation layer 21 is applied above the third metalization plane 16, that is to say above the metal strips 18, 19 and the oxide region 20 lying in between. Further oxide regions are provided between the individual metalization layers 14, 15, 16. The actual conduction of the strip conductor 12 is realized in the third metalization plane 16 by means of the metal strips 18, 19. The ground plane of the strip conductor is embodied in the first metalization plane 14 and additionally comprises the very low-resistance sinker contact 17 provided below the first metalization plane 14. The lossy substrate portion of the integrated strip conductor is obviated on account of the use of the first metal plane 14 with the underlaid sinker contact 17 as a counterconductor. The coil quality factor of the inductance 12 is improved even further as a result of this. Given the same inductance value, a significantly higher quality factor results for the microstripline type inductor than in the case of a comparable wound or spiral integrated coil.

Figure 4:
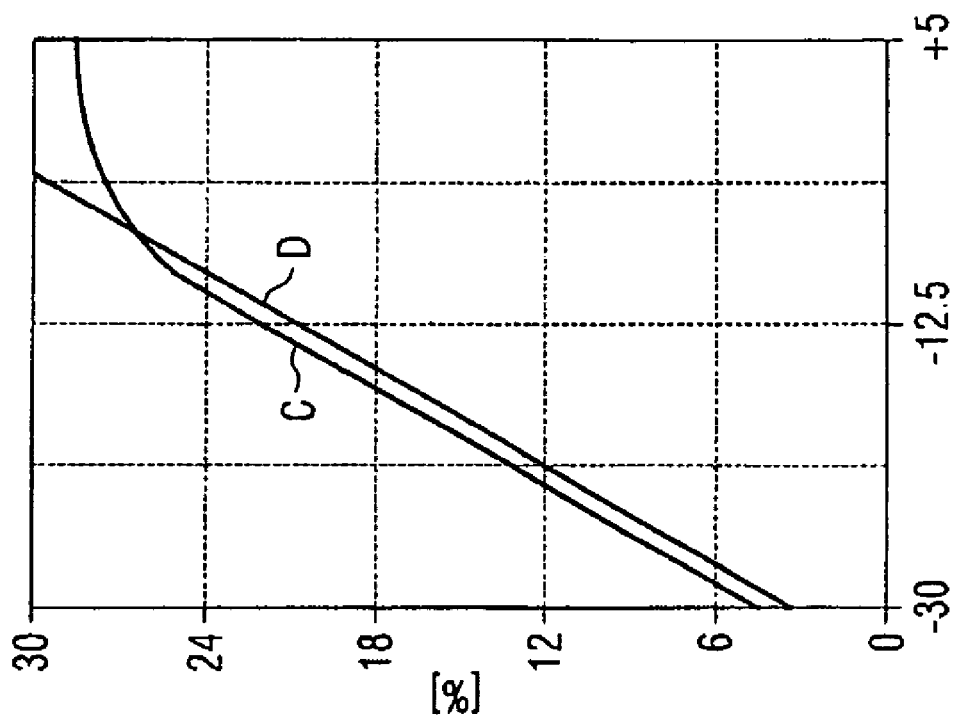
FIG. 4 is a graph illustrating the efficiency of an exemplary power amplifier according to the invention.

FIG. 4 provides a graph illustrating the overall efficiency of the amplifier arrangement of FIG. 1 in percent plotted against the input power in dBmW in a range of −30 to +5 dBm. It is evident from the curve A that the overall efficiency lies in a range of between 10 and 50% relative to the input power. A further curve B in FIG. 4 shows the current consumption of the amplifier arrangement, which rises to somewhat above 400 mA as a function of the input power.

Figure 5:
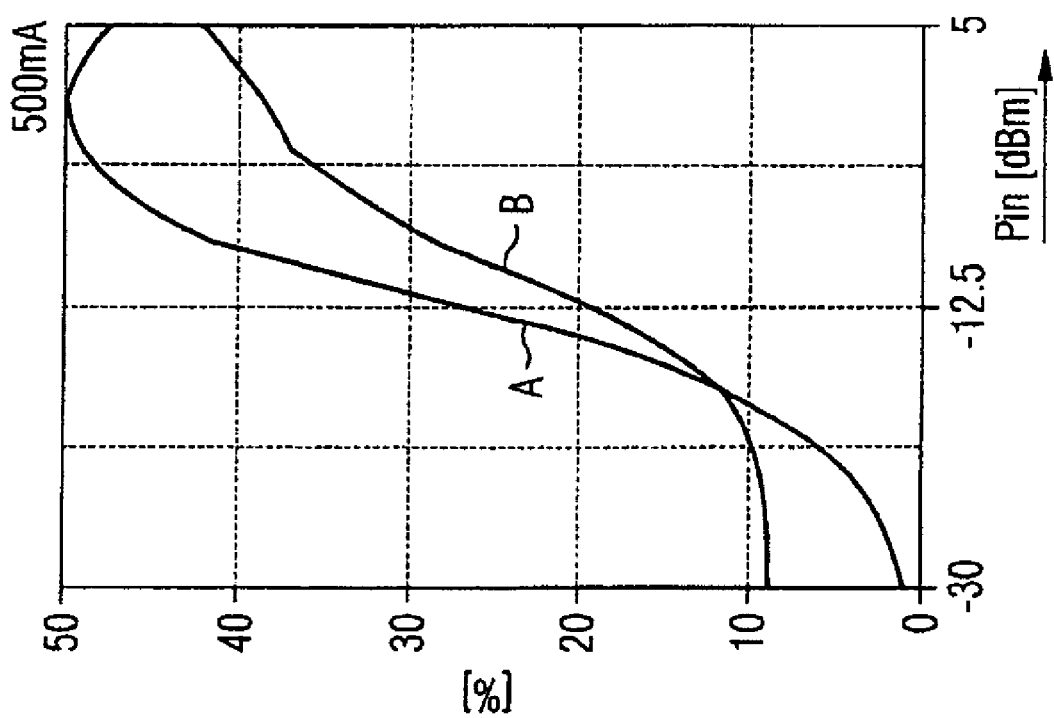
FIG. 5 is a graph illustrating the compression behavior of the exemplary integrated power amplifier.

FIG. 5 shows a power curve C of the exemplary amplifier according to the invention in a graph in which the output power in dBmW is plotted against the input power in dBmW. The input power is again specified in a range of −30 to +5 dBm, while the output power is plotted in a range of 0 to 30 dBm. An auxiliary line D is additionally depicted in order to determine the 1 dB compression point of the power characteristic curve C.

Figure 6:
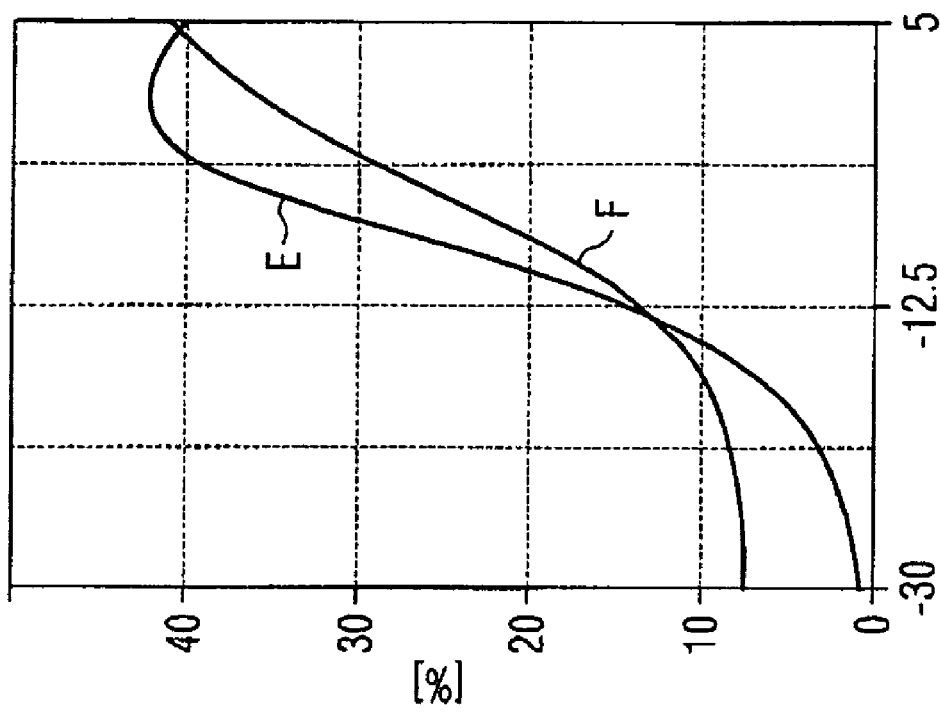
FIG. 6 is a graph illustrating the efficiency of a power amplifier without a microstrip conductor.

For comparison, FIG. 6 shows an efficiency characteristic curve E plotted in percent against the input power in dBmW in a range of −30 to +5 dBm. In addition, the curve for the current consumption F is once again depicted on a scale from 0 to 500 mA. The characteristic curves E, F of FIG. 6 apply to an amplifier arrangement in which an integrated wound coil is provided in the matching filter instead of the microstrip conductor according to the invention. A direct comparison of the efficiency characteristic curves E, A and the current consumption characteristic curves F, B reveals that, with a microstrip conductor in accordance with the invention, a significantly higher efficiency of the circuit can be recorded across the entire input power range.

Figure 7:
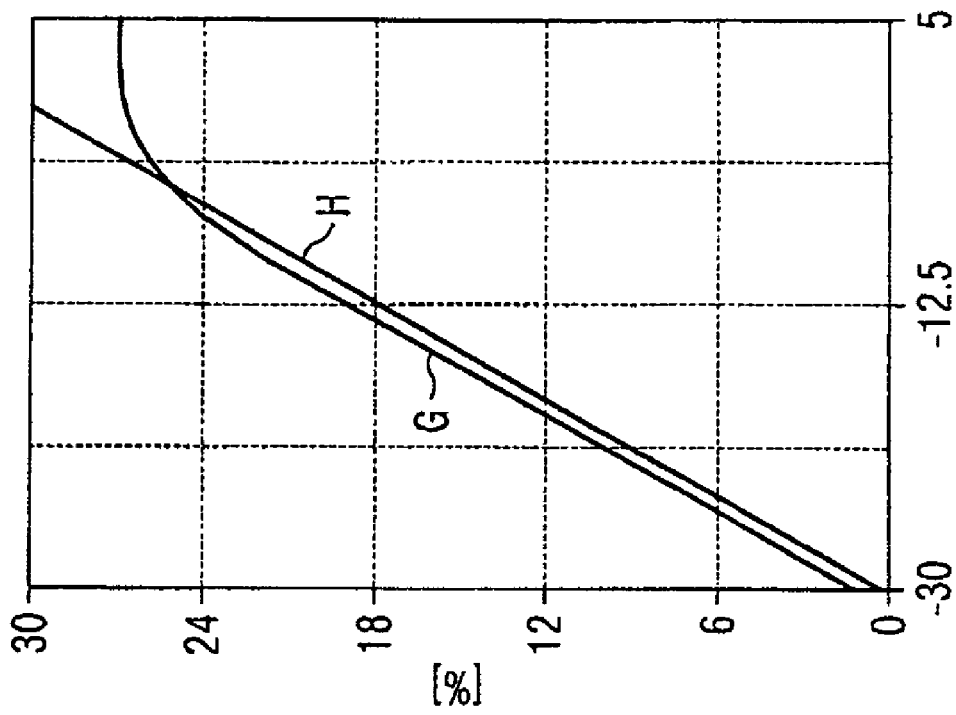
FIG. 7 is a graph illustrating the compression behavior of a power amplifier without a microstrip conductor.

FIG. 7 provides a graph illustrating a power curve G of an amplifier arrangement with an integrated wound inductance instead of the microstrip conductor according to the invention, in which the output power in dBmW is plotted against the input power in dBmW. The output power is plotted in a range of 0 to 30 and the input power in a range of −30 to +5. The straight line H is likewise depicted again as an auxiliary line for determining the 1 dB compression point. It is clearly evident when FIGS. 5 and 7 are compared with one another that the improvements achieved for amplifiers for the frequencies of 2.44 and 5.3 GHz are in excess of 1 dB for the saturation power and up to 1.8 dB for the 1 dB compression point, given approximately identical operating points. The diagrams in accordance with FIGS. 4 to 7 were determined on the basis of simulations using the example of an integrated amplifier for frequencies of 5.3 GHz.

It goes without saying that it lies within the scope of the invention also to transfer the principle proposed to other integration technologies such as MOS, metal oxide semiconductor, or GaAs, gallium arsenide.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An integrated power amplifier arrangement with multistage construction, comprising:
    an input transistor with a terminal for feeding an input signal;
    an output transistor with a terminal for providing an output signal;
    a matching filter with at least one capacitance and an inductance designed for impedance transformation, which couples the in put transistor to the output transistor, wherein the inductance is formed as a microstrip conductor;
    wherein the matching filter comprises a series circuit formed by a series capacitance and the microstrip conductor, said series circuit being coupled between an output terminal of the input transistor and an input terminal of the output transistor, and a shunt capacitance is provided, which couples a connecting node between the series capacitance and the microstrip conductor to a reference potential terminal.

2. The integrated power amplifier arrangement of claim 1, wherein an input resistance of the output transistor is less than or equal to 50 ohms.

3. The integrated power amplifier arrangement of claim 2, wherein the input resistance of the output transistor is less than or equal to 20 ohms.

4. The integrated power amplifier arrangement of claim 3, wherein the microstrip conductor is embodied in integrated fashion with two metal strips of planar extent.

5. The integrated power amplifier arrangement of claim 4, wherein one of the metal strips of the microstrip conductor is connected to a substrate terminal in large-area fashion by a ground through-plating.

6. The integrated power amplifier arrangement of claim 1, wherein the input resistance of the output transistor is less than or equal to 20 ohms.

7. The integrated power amplifier arrangement of claim 1, wherein the microstrip conductor is embodied in integrated fashion with two metal strips of planar extent.

8. An integrated power amplifier arrangement with multistage construction, comprising:
- an input transistor with a terminal for feeding an input signal;
- an output transistor with a terminal for providing an output signal; and
- a matching filter with at least one capacitance and an inductance designed for impedance transformation, which couples the input transistor to the output transistor, wherein the inductance is formed as a microstrip conductor;
- wherein the matching filter comprises a series circuit formed by a first series capacitance and a second series capacitance, said series circuit being coupled between an output terminal of the input transistor and an input terminal of the output transistor, and wherein the microstrip conductor is connected to a connecting node between the first series capacitance and the second series capacitance;
- wherein an input resistance of the output transistor is less than or equal to 20 ohms;
- wherein the microstrip conductor is embodied in integrated fashion with two metal strips of planar extent; and
- wherein one of the metal strips of the microstrip conductor is connected to a substrate terminal in large-area fashion by a ground through-plating.

9. The integrated power amplifier arrangement of claim 8, wherein the input resistance of the output transistor is less than or equal to 20 ohms.

10. The integrated power amplifier arrangement of claim 8, wherein the microstrip conductor is embodied in integrated fashion with two metal strips of planar extent.

11. An integrated power amplifier arrangement with multistage construction, comprising:
- an input transistor with a terminal for feeding an input signal;
- an output transistor with a terminal for providing an output signal;
- a matching filter with at least one capacitance and an inductance designed for impedance transformation, which couples the input transistor to the output transistor, wherein the inductance is formed as a microstrip conductor;
- wherein the microstrip conductor is embodied in integrated fashion with two metal strips of planar extent; and
- wherein one of the metal strips of the microstrip conductor is connected to a substrate terminal in large-area fashion by a ground through-plating.

12. The integrated power amplifier arrangement of claim 11, wherein the two metal strips of planar extent are parallel to one another.

13. The integrated power amplifier arrangement of claim 11, wherein the two metal strips reside within a metallization plane on or in the semiconductor body of an integrated circuit.

14. The integrated power amplifier arrangement of claim 13, further comprising a second, different metallization plane, wherein a reference potential structure resides therein comprising a reference potential plane.

* * * * *

UNITED STATES PATENT AND TRADEMARK OFFICE
CERTIFICATE OF CORRECTION

| | | |
|---|---|---|
| PATENT NO. | : 7,199,667 B2 | Page 1 of 1 |
| APPLICATION NO. | : 10/950982 | |
| DATED | : April 3, 2007 | |
| INVENTOR(S) | : Günter Donig et al. | |

It is certified that error appears in the above-identified patent and that said Letters Patent is hereby corrected as shown below:

Column 6, line 47: Please replace the word "in put" with the word --input--.

Signed and Sealed this

Twenty-first Day of August, 2007

JON W. DUDAS
*Director of the United States Patent and Trademark Office*